(12) United States Patent
Katsumata et al.

(10) Patent No.: US 11,703,543 B2
(45) Date of Patent: Jul. 18, 2023

(54) POWER CONVERSION DEVICE

(71) Applicants: FUJI ELECTRIC CO., LTD., Kawasaki (JP); HONDA MOTOR CO., LTD., Tokyo (JP)

(72) Inventors: Hiroki Katsumata, Hino (JP); Nobuhisa Ando, Suzuka (JP); Shinichi Yokoyama, Wako (JP)

(73) Assignees: FUJI ELECTRIC CO., LTD., Kawasaki (JP); HONDA MOTOR CO., LTD., Tokyo (JP)

( * ) Notice: Subject to any disclaimer, the term of this patent is extended or adjusted under 35 U.S.C. 154(b) by 65 days.

(21) Appl. No.: 17/218,858

(22) Filed: Mar. 31, 2021

(65) Prior Publication Data
US 2021/0325463 A1  Oct. 21, 2021

(30) Foreign Application Priority Data

Apr. 17, 2020 (JP) ................................. 2020-074010

(51) Int. Cl.
G01R 31/327 (2006.01)
B60R 16/03 (2006.01)
G01R 31/00 (2006.01)

(52) U.S. Cl.
CPC .......... *G01R 31/3278* (2013.01); *B60R 16/03* (2013.01); *G01R 31/005* (2013.01)

(58) Field of Classification Search
CPC .... G01R 31/3278; G01R 31/005; B60R 16/03
See application file for complete search history.

(56) References Cited

U.S. PATENT DOCUMENTS

| 6,683,778 | B2 | 1/2004 | Yugou |
| 8,174,244 | B2 | 5/2012 | Otake |
| 8,541,978 | B2 | 9/2013 | Fukuo et al. |
| 2003/0007305 | A1 | 1/2003 | Yugou |
| 2014/0111120 | A1 | 4/2014 | Mitsutani |

(Continued)

FOREIGN PATENT DOCUMENTS

| EP | 2159898 A1 | 3/2010 |
| EP | 2325974 A2 | 5/2011 |
| JP | 3789819 B2 | 6/2006 |

(Continued)

OTHER PUBLICATIONS

Europe Patent Office, "Search Report for European Patent Application No. 21165740.8," dated Oct. 1, 2021.

(Continued)

*Primary Examiner* — Feba Pothen
(74) *Attorney, Agent, or Firm* — Manabu Kanesaka

(57) ABSTRACT

A power conversion device includes a power converter, a relay, and a welding detector. The welding detector includes a first resistor connected to a terminal of the relay on a first side, a capacitor and a second resistor, both of which are connected to a terminal of the relay on a second side, an application unit to apply an inspection signal to the relay via the capacitor and the second resistor, and a determiner connected between the capacitor and the second resistor, the determiner detecting a signal based on application of the inspection signal by the application unit to determine whether or not the relay is welded.

6 Claims, 10 Drawing Sheets

(56) References Cited

U.S. PATENT DOCUMENTS

2015/0016007 A1\* 1/2015 Zink .................. H01H 47/002
  361/170

FOREIGN PATENT DOCUMENTS

| JP | 2011-185812 A | | 9/2011 |
|---|---|---|---|
| JP | 2016208580 A | \* | 12/2016 |
| KR | 20140078946 A | \* | 6/2014 |

OTHER PUBLICATIONS

Japan Patent Office, "Office Action for Japanese Patent Application No. 2020-074010," dated Mar. 8, 2022.

\* cited by examiner

POWER CONVERSION DEVICE

CROSS-REFERENCE TO RELATED APPLICATION

The present application claims priority of Japanese Patent Application No. 2020-074010 filed Apr. 17, 2020, the disclosure of which is hereby incorporated by reference.

BACKGROUND OF THE INVENTION

Field of the Invention

The present invention relates to a power conversion device, and more particularly, it relates to a power conversion device that determines whether or not a relay is welded.

Description of the Background Art

A power conversion device that determines whether or not a relay is welded is known in general, as disclosed in Japanese Patent No. 3789819, for example.

Japanese Patent No. 3789819 discloses an in-vehicle device (in-vehicle power conversion device) including a relay provided in a power supply line and a detection circuit that includes a plurality of photocouplers and detects (determines) whether or not the relay is welded.

In the in-vehicle device (in-vehicle power conversion device) disclosed in Japanese Patent No. 3789819, the detection circuit including the plurality of photocouplers, which are components having a relatively short life, is used to detect (determine) whether or not the relay is welded. Therefore, the photocouplers, which are components having a relatively short life, are used, and thus a period until one of the plurality of photocouplers fails due to the life is short. Thus, the reliability of the detection circuit as a determiner that determines whether or not the relay is welded is low.

SUMMARY OF THE INVENTION

The present invention has been proposed in order to solve the aforementioned problem, and an object of the present invention is to provide a power conversion device capable of significantly reducing or preventing a decrease in the reliability of a determiner that determines whether or not a relay is welded.

In order to attain the aforementioned object, a power conversion device according to an aspect of the present invention includes a power converter to convert power supplied to a vehicle, a relay provided in a power supply line connected to the power converter, and a welding detector to detect welding of the relay. The welding detector includes a first resistor connected to a terminal of the relay on a first side, a capacitor and a second resistor, both of which are connected to a terminal of the relay on a second side, an application unit to apply an inspection signal to the relay via the capacitor and the second resistor, and a determiner connected between the capacitor and the second resistor, the determiner detecting a signal based on application of the inspection signal by the application unit to determine whether or not the relay is welded.

As described above, the power conversion device according to this aspect of the present invention includes the welding detector including the first resistor connected to the terminal of the relay on the first side, the capacitor and the second resistor, both of which are connected to the terminal of the relay on the second side, the application unit to apply the inspection signal to the relay via the capacitor and the second resistor, and the determiner connected between the capacitor and the second resistor, the determiner detecting the signal based on the application of the inspection signal by the application unit to determine whether or not the relay is welded. Accordingly, welding of the relay can be determined using the resistors and the capacitor having a relatively long life as components, and thus as compared with a case in which photocouplers having a relatively short life are used as components, a decrease in the reliability of the determiner that determines whether or not the relay is welded can be significantly reduced or prevented. Furthermore, the applied inspection signal is delayed by the first resistor, and a signal is input to the determiner such that the determiner can easily determine whether or not the relay is welded based on the signal delay.

In the aforementioned power conversion device according to this aspect, the relay preferably includes, on the second side, a first terminal and a second terminal, and switches a terminal connected to the terminal on the first side between the first terminal and the second terminal, the capacitor, the second resistor, and the determiner are preferably connected to each of the first terminal and the second terminal, and the determiner of the welding detector preferably determines whether or not the relay is welded based on signals input from both the first terminal and the second terminal by the application of the inspection signal by the application unit. Accordingly, a decrease in the reliability of the determiner that determines whether or not the relay that switches the power supply line between the first terminal and the second terminal is welded to the first terminal side or the second terminal side can be significantly reduced or prevented.

In this case, the determiner of the welding detector preferably determines whether or not the relay is welded based on a time difference between the signals input from both the first terminal and the second terminal by the application of the inspection signal by the application unit. Accordingly, the first resistor connected to the terminal on the first side is connected to the terminal connected to the terminal of the relay on the first side among the first terminal and the second terminal of the relay on the second side such that the applied inspection signal is delayed, and a signal is input to the determiner. Thus, the determiner can more easily determine whether or not the relay is welded based on the time difference between the input signals.

In the aforementioned power conversion device according to this aspect, the application unit of the welding detector preferably applies a pulse voltage as the inspection signal to the relay. Accordingly, the determiner can easily detect signal delay caused by the first resistor connected to the relay by comparing the timing of the pulse wave of the pulse voltage with the timing of the signal input to the determiner.

In the aforementioned power conversion device according to this aspect, the determiner preferably includes a controller configured to perform a control to detect the signal based on the application of the inspection signal by the application unit to determine whether or not the relay is welded. Accordingly, as compared with a case in which a determination is made using a hardware circuit, it is possible to more easily determine whether or not the relay is welded under software control of the controller.

In the aforementioned power conversion device according to this aspect, the determiner is preferably connected between the capacitor and the second resistor via a binarization unit that binarizes the signal based on the application of the inspection signal by the application unit. Accordingly, the signal input to the determiner can be binarized to facilitate detection of signal delay.

In this case, the binarization unit preferably binarizes a decreasing signal using a first threshold, and binarizes an increasing signal using a second threshold different from the first threshold. Accordingly, the threshold in a case in which the signal increases and the threshold in a case in which the signal decreases can be different from each other, and thus the signal input to the determiner can be binarized using the threshold suitable for each of the increase and decrease of the signal.

In the aforementioned power conversion device according to this aspect, the relay preferably includes a first relay and a second relay provided in series in the power supply line, each of the first relay and the second relay preferably includes, on the second side, a first terminal and a second terminal, and switches a terminal connected to the terminal on the first side between the first terminal and the second terminal, the terminal of the first relay on the first side is preferably connected to the first terminal of the second relay on the second side, the welding detector preferably includes a common first resistor provided at the terminal of the second relay on the first side, and the capacitor and the second resistor, both of which are provided at each of the first terminal of the first relay on the second side, the second terminal of the first relay on the second side, and the second terminal of the second relay on the second side, and the determiner, in a state in which the terminal of the second relay on the first side and the first terminal of the second relay on the second side are connected to each other, preferably determines whether or not the first relay is welded based on signals input from the first terminal and the second terminal of the first relay on the second side via the first resistor, and the capacitor and the second resistor, both of which are provided at each of the first terminal and the second terminal of the first relay on the second side, and determines whether or not the second relay is welded based on signals input from the first terminal and the second terminal of the second relay on the second side via the first resistor, the capacitor and the second resistor, both of which are provided at the first terminal or the second terminal of the first relay on the second side, and the capacitor and the second resistor, both of which are provided at the second terminal of the second relay on the second side. Accordingly, the common first resistor is provided for the first relay and the second relay, and thus it is not necessary to separately provide first resistors for the first relay and the second relay. Furthermore, the three capacitors and the three second resistors are provided for the first terminal and the second terminal of the first relay and the first terminal and the second terminal of the second relay, and thus it is not necessary to separately provide four capacitors and four second resistors for the first terminal and the second terminal of the first relay and the first terminal and the second terminal of the second relay. Thus, an increase in the number of components of the welding detector can be significantly reduced or prevented, and the circuit configuration of the welding detector can be simplified.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are hereinafter described with reference to the drawings.

First Embodiment

The configuration of a power conversion device 100 according to a first embodiment is now described with reference to FIGS. 1 to 3.

Figure 1:
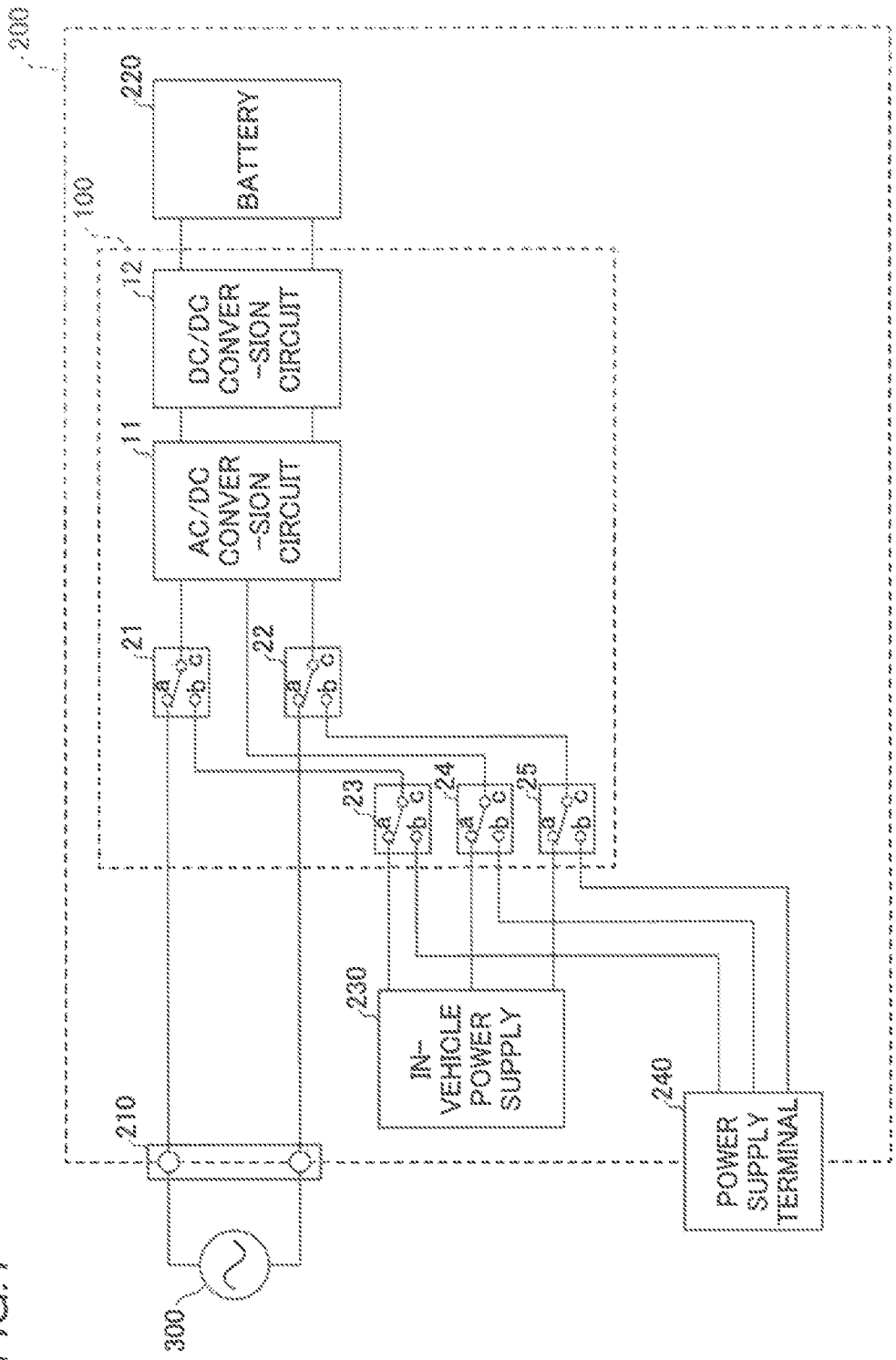
FIG. 1 is a block diagram showing a vehicle including a power conversion device according to a first embodiment.

As shown in FIG. 1, the power conversion device 100 according to the first embodiment is mounted on an electric vehicle 200. The electric vehicle 200 runs by driving a motor with power charged in a battery 220. The electric vehicle 200 is connected to an external power supply 300 via a connector 210 such that the battery 220 can be charged from the external power supply 300. The electric vehicle 200 can supply the power of the battery 220 to electric equipment in the vehicle via an in-vehicle power supply 230. The electric vehicle 200 can supply the power of the battery 220 to a house or the like via a power supply terminal 240 for single-phase three-wire commercial power (100V/200V AC power). The electric vehicle 200 is an example of a "vehicle" in the claims.

The battery 220 includes a storage battery capable of charging power. The storage battery is a lithium-ion secondary battery, for example. The battery 220 charges DC power converted by the power conversion device 100 from AC power input from the external power supply 300 outside a vehicle body. The battery 220 can output the stored (charged) power as DC power.

(Configuration of Power Conversion Device)

As shown in FIG. 1, the power conversion device 100 includes an AC/DC conversion circuit 11, a DC/DC conversion circuit 12, and relays 21, 22, 23, 24, and 25. As shown in FIG. 2, the power conversion device 100 includes a welding detector 30. The welding detector 30 includes a CPU 31, a relay drive circuit 32, and an application unit 33. The welding detector 30 includes resistors R101, R102, R201, R202, and R301. The welding detector 30 includes capacitors C101, C102, C201, and C202. The welding detector 30 includes binarization units IC101 and IC201. The AC/DC conversion circuit 11 and the DC/DC conversion circuit 12 are examples of a "power converter" in the claims, and the CPU 31 is an example of a "determiner" or a "controller" in the claims. The resistor R301 is an example of a "first resistor" in the claims, and the resistors R101 and R201 are examples of a "second resistor" in the claims.

The power conversion device 100 converts AC power supplied from the external power supply 300 into DC power and supplies the DC power to the battery 220. Furthermore, the power conversion device 100 converts the DC power supplied from the battery 220 into AC power and supplies the AC power to the in-vehicle power supply 230 or the power supply terminal 240.

The relays 21 and 22 switch between supplying (charging) power from the external power supply 300 to the battery 220 and supplying (discharging) power from the battery 220 to the in-vehicle power supply 230 or the power supply terminal 240. Specifically, when power is supplied (charged) from the external power supply 300 to the battery 220, each of the relays 21 and 22 is controlled such that terminals a and c are connected to each other. When power is supplied (discharged) from the battery 220 to the in-vehicle power supply 230 or the power supply terminal 240, each of the relays 21 and 22 is controlled such that terminals b and c are connected to each other.

The relays 23, 24, and 25 switch between supplying (discharging) power from the battery 220 to the in-vehicle power supply 230 and supplying (discharging) power from the battery 220 to the power supply terminal 240. Specifically, when power is supplied (discharged) from the battery 220 to the in-vehicle power supply 230, each of the relays 23, 24, and 25 is controlled such that terminals a and c are connected to each other. When power is supplied (discharged) from the battery 220 to the power supply terminal 240, each of the relays 23, 24, and 25 is controlled such that terminals b and c are connected to each other.

The AC/DC conversion circuit 11 and the DC/DC conversion circuit 12 convert power supplied to the electric vehicle 200. Specifically, the AC/DC conversion circuit 11 and the DC/DC conversion circuit 12 convert the AC power supplied from the external power supply 300 into DC power and supply the DC power to the battery 220. The AC/DC conversion circuit 11 and the DC/DC conversion circuit 12 convert the DC power supplied from the battery 220 into AC power and supply the AC power to the in-vehicle power supply 230 or the power supply terminal 240. The AC/DC conversion circuit 11 and the DC/DC conversion circuit 12 include a plurality of switching elements and a plurality of capacitors, and convert and output the input power.

The AC/DC conversion circuit 11 converts the AC power supplied from the external power supply 300 into DC power and supplies the DC power to the DC/DC conversion circuit 12 when the battery 220 is charged. The AC/DC conversion circuit 11 converts the DC power supplied from the DC/DC conversion circuit 12 into AC power and supplies the AC power to the in-vehicle power supply 230 or the power supply terminal 240 when the battery 220 is discharged.

The DC/DC conversion circuit 12 converts the voltage of the DC power supplied from the AC/DC conversion circuit 11 and supplies the DC power to the battery 220 when the battery 220 is charged. The DC/DC conversion circuit 12 converts the voltage of the DC power supplied from the battery 220 and supplies the DC power to the AC/DC conversion circuit 11 when the battery 220 is discharged.

The relays 21 to 25 are provided in a power supply line connected to the AC/DC conversion circuit 11 and the DC/DC conversion circuit 12. As shown in FIG. 2, the relays 21 to 25 are controlled by the CPU 31 via the relay drive circuit 32 such that the connections can be switched. Each of the relays 21 to 25 includes the terminal c on a first side and the terminals a and b on a second side. The relays 21 to 25 switch a terminal connected to the terminal c between the terminals a and b.

Figure 2:
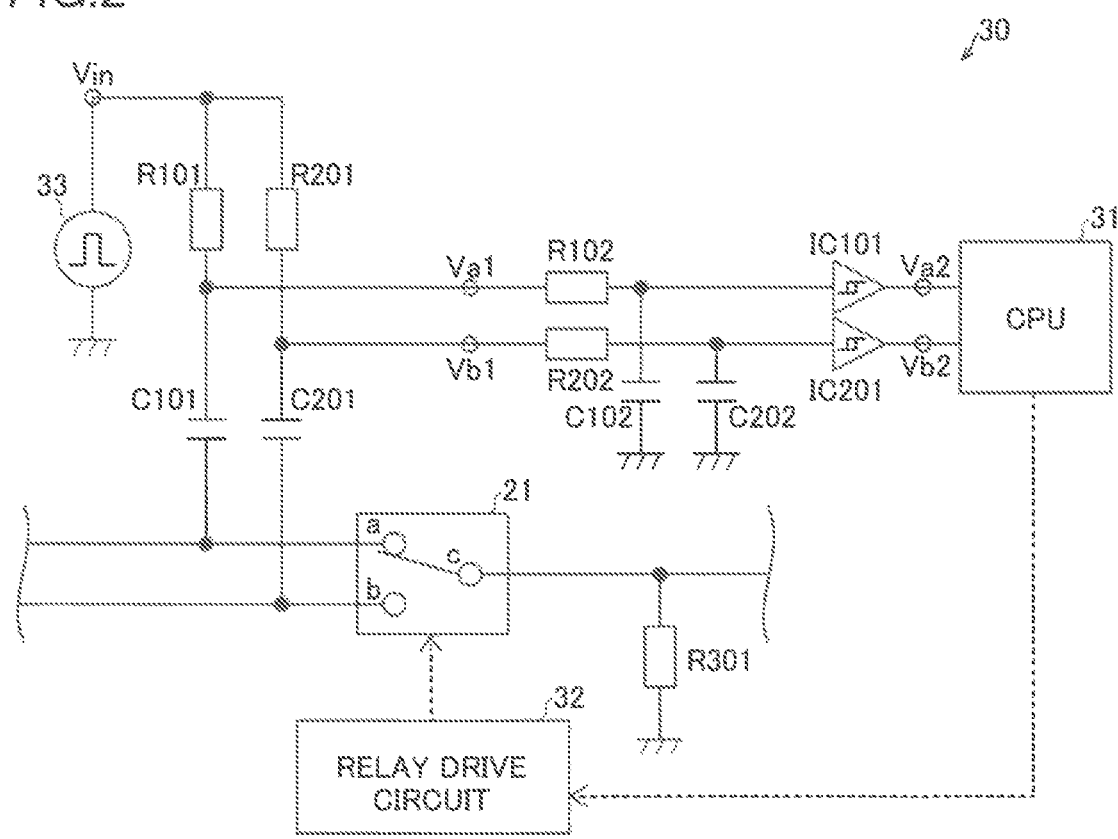
FIG. 2 is a circuit diagram showing a welding detector of the power conversion device according to the first embodiment.

As shown in FIG. 2, the welding detector 30 detects welding of the relays 21 to 25. Although FIG. 2 shows the configuration in which the welding detector 30 is provided for the relay 21, the same applies to the relays 22 to 25.

The capacitor C101 is connected to the terminal a of the relay 21. That is, the capacitor C101 is connected to the power supply line. The resistor R101 is connected to the capacitor C101. Furthermore, the resistor R101 is connected to the application unit 33. The application unit 33 is connected to a ground. The resistor R102 is connected between the resistor R101 and the capacitor C101. The binarization unit IC101 is connected to the resistor R102. The CPU 31 is connected to the binarization unit IC101. The capacitor C102 is connected between the resistor R102 and the binarization unit IC101. The capacitor C102 is connected to the ground.

The capacitor C201 is connected to the terminal b of the relay 21. That is, the capacitor C201 is connected to the power supply line. The resistor R201 is connected to the capacitor C201. Furthermore, the resistor R201 is connected to the application unit 33. The application unit 33 is connected to the ground. The resistor R202 is connected between the resistor R201 and the capacitor C201. The binarization unit IC201 is connected to the resistor R202. The CPU 31 is connected to the binarization unit IC201. The capacitor C202 is connected between the resistor R202 and the binarization unit IC201. The capacitor C202 is connected to the ground.

The resistor R301 is connected to the terminal c of the relay 21. Furthermore, the resistor R301 is connected to the ground.

The capacitors C101 and C201 are provided such that a high voltage is not applied to the CPU 31 driven by power having a relatively low voltage (about 5V) from the power supply line in which power having a relatively high voltage (100V, 200V) is conducted. The resistors R101 and R201 are provided such that an excessive current does not flow through the capacitors C101 and C201.

The resistor R102 and the capacitor C102 form an RC circuit and delay an applied voltage from the application unit 33. The resistor R202 and the capacitor C202 form an RC circuit and delay an applied voltage from the application unit 33. The resistor R301 delays a voltage applied to the connected terminal (terminal a or b).

That is, the welding detector 30 includes the resistor R301 connected to the terminal c of the relay 21 on the first side, the capacitor C101 (C201) and the resistor R101 (R201) connected to the terminal a (b) of the relay 21 on the second side, the application unit 33 that applies an inspection signal to the relay 21 via the capacitor C101 (C201) and the resistor R101 (R201), and the CPU 31 connected between the capacitor C101 (C201) and the resistor R101 (R201) and configured to detect a signal change based on application of the inspection signal by the application unit 33 to determine whether or not the relay 21 is welded.

In the welding detector 30, the capacitor C101 (C201), the resistor R101 (R201), and the CPU 31 are connected to each of the terminals a and b of the relay 21 (22 to 25). The CPU 31 of the welding detector 30 determines whether or not the relay 21 (22 to 25) is welded based on signals input from both the terminals a and b by application of the inspection signal by the application unit 33.

Specifically, the CPU 31 of the welding detector 30 determines whether or not the relay 21 (22 to 25) is welded based on a time difference between the signals input from both the terminals a and b by application of the inspection signal by the application unit 33. That is, the signal of the terminal connected to the resistor 301 among the signals input from both the terminals a and b is delayed, and thus the CPU 31 detects that the terminal with the delayed signal of the relay 21 is connected. Then, the CPU 31 compares the terminal a or b of the relay 21 connected by control via the relay drive circuit 32 with the terminal a or b, the connection of which has been detected due to the signal delay. When the terminal a or b connected by control and the terminal a or b, the connection of which has been detected match, the CPU 31 determines that the relay 21 is not welded. On the other hand, when the terminal a or b connected by control and the terminal a or b, the connection of which has been detected are different, the CPU 31 determines that the relay 21 is welded to the terminal a or b, the connection of which has been detected.

The CPU 31 is connected between the capacitor C101 (C201) and the resistor R101 (R201) via the binarization unit IC101 (IC201) that binarizes a signal based on application of the inspection signal by the application unit 33. As shown in FIG. 3, the binarization unit IC101 (IC201) binarizes a decreasing signal using a first threshold, and binarizes an increasing signal using a second threshold different from the first threshold. For example, the first threshold is smaller than the second threshold. Each of the binarization units IC101 and IC201 includes a Schmitt trigger IC, for example.

The CPU 31 includes a controller configured to perform a control to detect a signal change based on application of the inspection signal by the application unit 33 to determine whether or not the relay 21 (22 to 25) is welded. That is, the CPU 31 controls the welding detection operation of the welding detector 30 by executing a program (software). The CPU 31 controls driving of the relay drive circuit 32 to switch the relay 21 (22 to 25). Furthermore, the CPU 31 controls the application unit 33 to apply a signal (voltage).

Figure 3:
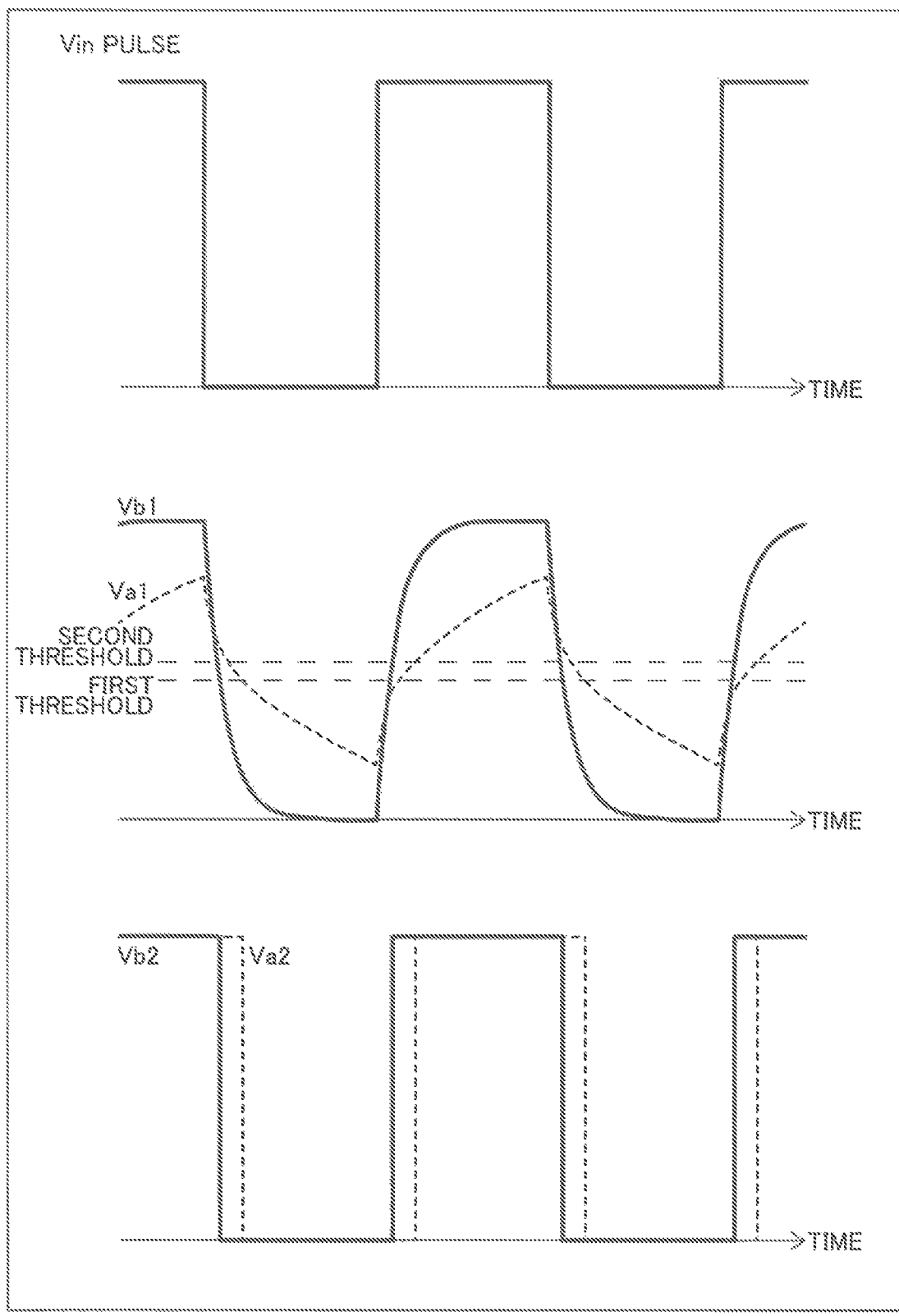
FIG. 3 is a diagram showing an example of a time change of a voltage at each position of the welding detector at the time of detecting welding of the relay of the power conversion device according to the first embodiment.

As shown in FIG. 3, the application unit 33 of the welding detector 30 applies a pulse voltage as an inspection signal to the relay 21 (22 to 25).

(Welding Detection Operation)

The welding detection operation for the relay 21 (22 to 25) by the CPU 31 is now described with reference to FIG. 3.

In an example of FIG. 3, a case in which the terminal a of the relay 21 (22 to 25) is connected to the terminal c as shown in FIG. 2 is described. The CPU 31 controls the application unit 33 to apply a pulse voltage. The terminal b of the relay 21 is not connected to the terminal c, and thus a voltage Vb1 has a first-order lag waveform due to the resistor R201, the resistor R202, and the capacitor C202. On the other hand, the terminal a of the relay 21 is connected to the terminal c, and thus a voltage Va1 has a waveform (further delayed waveform) influenced by the capacitor C101 and the resistor R301 in addition to the resistor R101, the resistor R102, and the capacitor C102. There is the above difference between the terminals b and a of the relay 21, and thus there is a time difference between the outputs of the binarization units IC101 and IC201. This time difference causes a waveform (voltage Va2) on the side with which the relay 21 is conducting to be delayed with respect to a waveform (voltage Vb2) on the side not conducting with the relay 21. From the above, it is possible to determine the connected terminal (a or b) of the relay 21. When the terminal b of the relay 21 is connected to the terminal c, the waveform (voltage Vb2) on the side with which the relay 21 is conducting is delayed with respect to the waveform (voltage Va2) on the side not conducting with the relay 21.

For example, the CPU 31 applies a pulse voltage from the application unit 33 while outputting a control signal such that in the relay 21, the terminal a is connected to the terminal c. When detecting an input of the waveform in which the voltage Va2 is delayed with respect to the voltage Vb2, the CPU 31 determines that the relay 21 is normal (not welded). On the other hand, when detecting an input of the waveform in which the voltage Vb2 is delayed with respect to the voltage Va2, the CPU 31 determines that the relay 21 is abnormal (welding has occurred).

A phase difference between the voltage Vat and the voltage Vb2 can be detected by monitoring each H/L state with a digital input port of the CPU 31. Furthermore, the pulse voltage can be achieved by outputting an H/L signal having a fixed cycle from a digital output port of the CPU 31.

Advantageous Effects of First Embodiment

According to the first embodiment, the following advantageous effects are achieved.

According to the first embodiment, as described above, the power conversion device 100 includes the welding detector 30 including the resistor R301 connected to the terminal c of the relay 21 (22 to 25) on the first side, the capacitor C101 (C201) and the resistor R101 (R201) connected to the terminal a (b) of the relay 21 (22 to 25) on the second side, the application unit 33 that applies an inspection signal to the relay 21 (22 to 25) via the capacitor C101 (C201) and the resistor R101 (R201), and the CPU 31 connected between the capacitor C101 (C201) and the resistor R101 (R201) and configured to detect a signal change based on application of the inspection signal by the application unit 33 to determine whether or not the relay 21 (22 to 25) is welded. Accordingly, welding of the relay 21 (22 to 25) can be determined using the resistors and the capacitor having a relatively long life as components, and thus as compared with a case in which photocouplers having a relatively short life are used as components, a decrease in the reliability of the determiner (CPU 31) that determines whether or not the relay 21 (22 to 25) is welded can be significantly reduced or prevented. Furthermore, the applied inspection signal is delayed by the resistor R301, and a signal is input to the CPU 31 such that the CPU 31 can easily determine whether or not the relay 21 (22 to 25) is welded based on the signal delay.

According to the first embodiment, as described above, the capacitor C101 (C201), the resistor R101 (R201), and the CPU 31 are connected to each of the terminals a and b of the relay 21 (22 to 25), and the CPU 31 of the welding detector 30 determines whether or not the relay 21 (22 to 25) is welded based on the signals input from both the terminals a and b by application of the inspection signal by the application unit 33. Accordingly, a decrease in the reliability of the determiner (CPU 31) that determines whether or not the relay 21 (22 to 25) that switches the power supply line between the terminals a and b is welded to the terminal a side or the terminal b side can be significantly reduced or prevented.

According to the first embodiment, as described above, the CPU 31 of the welding detector 30 determines whether or not the relay 21 (22 to 25) is welded based on the time difference between the signals input from both the terminals a and b by application of the inspection signal by the application unit 33. Accordingly, the resistor R301 connected to the terminal on the first side is connected to the terminal connected to the terminal of the relay 21 (22 to 25) on the first side among the terminals a and b of the relay 21 (22 to 25) on the second side such that the applied inspection signal is delayed, and a signal is input to the CPU 31. Thus, the CPU 31 can more easily determine whether or not the relay 21 (22 to 25) is welded based on the time difference between the input signals.

According to the first embodiment, as described above, the application unit 33 of the welding detector 30 applies a pulse voltage as an inspection signal to the relay 21 (22 to 25). Accordingly, the CPU 31 can easily detect signal delay caused by the resistor R301 connected to the relay 21 (22 to 25) by comparing the timing of the pulse wave of the pulse voltage with the timing of the signal input to the CPU 31.

According to the first embodiment, as described above, the CPU 31 is connected between the capacitor C101 (C201) and the resistor R101 (R201) via the binarization unit IC101 (IC201) that binarizes the signal based on application of the inspection signal by the application unit 33. Accordingly, the signal input to the CPU 31 can be binarized to facilitate detection of signal delay.

According to the first embodiment, as described above, the binarization unit IC101 (IC201) binarizes the decreasing signal using the first threshold, and binarizes the increasing signal using the second threshold different from the first threshold.

Accordingly, the threshold in a case in which the signal increases and the threshold in a case in which the signal decreases can be different from each other, and thus the signal input to the CPU 31 can be binarized using the threshold suitable for each of the increase and decrease of the signal.

Second Embodiment

The configuration of a power conversion device according to a second embodiment is now described with reference to FIGS. 4 to 10. In the second embodiment, an example of a welding detector having a configuration using common resistors for relays provided in series unlike the first embodiment is described.

Figure 4:
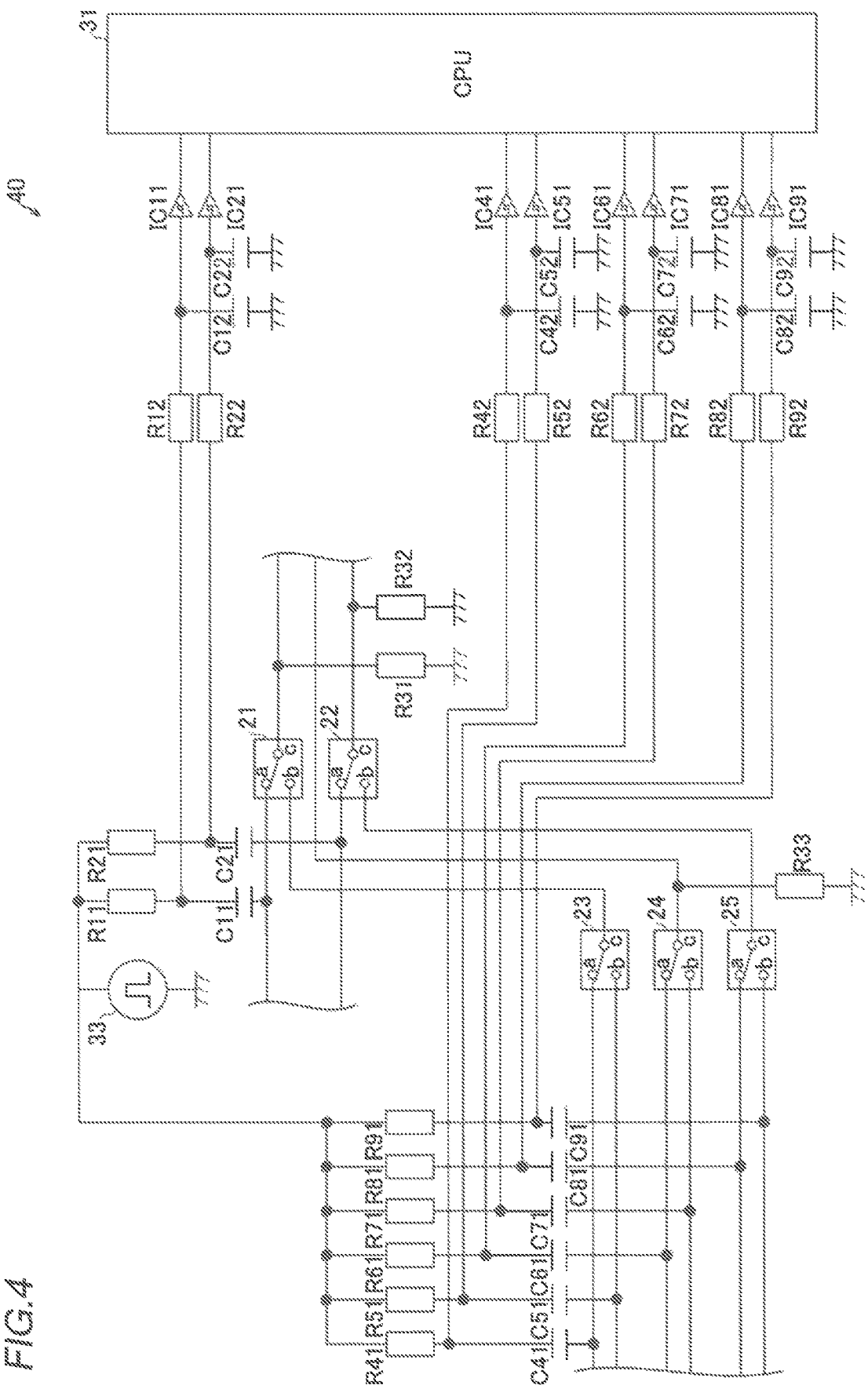
FIG. 4 is a circuit diagram showing a welding detector of a power conversion device according to a second embodiment.

In the second embodiment, as shown in FIG. 4, a welding detector 40 includes a CPU 31, relay drive circuits 34 and 35 (see FIG. 5), and an application unit 33. Furthermore, as shown in FIG. 4, the welding detector 40 includes resistors R11, R12, R21, R22, R31, R32, R33, R41, R42, R51, R52, R61, R62, R71, R72, R81, R82, R91, and R92. The welding detector 40 includes capacitors C11, C12, C21, C22, C41, C42, C51, C52, C61, C62, C71, C72, C81, C82, C91, and C92. The welding detector 40 includes binarization units IC11, IC21, IC41, IC51, IC61, IC71, IC81, and IC91. The CPU 31 is an example of a "determiner" or a "controller" in the claims. The resistors R31, R32, and R33 are examples of a "first resistor" in the claims, and the resistors R11, R21, R41, R51, R61, R71, R81, and R91 are examples of a "second resistor" in the claims.

The capacitor C11 is connected to a terminal a of a relay 21. That is, the capacitor C11 is connected to a power supply line. The resistor R11 is connected to the capacitor C11. Furthermore, the resistor R11 is connected to the application unit 33. The application unit 33 is connected to a ground. The resistor R12 is connected between the resistor R11 and the capacitor C11. The binarization unit IC11 is connected to the resistor R12. The CPU 31 is connected to the binarization unit IC11. The capacitor C12 is connected between the resistor R12 and the binarization unit IC11. The capacitor C12 is connected to the ground. The relay 21 is an example of a "second relay" in the claims.

The capacitor C21 is connected to a terminal a of a relay 22. That is, the capacitor C21 is connected to the power supply line. The resistor R21 is connected to the capacitor C21. Furthermore, the resistor R21 is connected to the application unit 33. The resistor R22 is connected between the resistor R21 and the capacitor C21. The binarization unit IC21 is connected to the resistor R22. The CPU 31 is connected to the binarization unit IC21. The capacitor C22 is connected between the resistor R22 and the binarization unit IC21. The capacitor C22 is connected to the ground. The relay 22 is an example of a "second relay" in the claims.

The resistor R31 is connected to a terminal c of the relay 21. Furthermore, the resistor R31 is connected to the ground. The resistor R32 is connected to a terminal c of the relay 22. Furthermore, the resistor R32 is connected to the ground.

The capacitor C41 is connected to a terminal a of a relay 23. That is, the capacitor C41 is connected to the power supply line. The resistor R41 is connected to the capacitor C41. Furthermore, the resistor R41 is connected to the application unit 33. The resistor R42 is connected between the resistor R41 and the capacitor C41. The binarization unit IC41 is connected to the resistor R42. The CPU 31 is connected to the binarization unit IC41. The capacitor C42 is connected between the resistor R42 and the binarization unit IC41. The capacitor C42 is connected to the ground. The relay 23 is an example of a "first relay" in the claims.

The capacitor C51 is connected to a terminal b of the relay 23. That is, the capacitor C51 is connected to the power supply line. The resistor R51 is connected to the capacitor C51. Furthermore, the resistor R51 is connected to the application unit 33. The resistor R52 is connected between the resistor R51 and the capacitor C51. The binarization unit IC51 is connected to the resistor R52. The CPU 31 is connected to the binarization unit IC51. The capacitor C52 is connected between the resistor R52 and the binarization unit IC51. The capacitor C52 is connected to the ground.

The capacitor C61 is connected to a terminal a of a relay 24. That is, the capacitor C61 is connected to the power supply line. The resistor R61 is connected to the capacitor C61. Furthermore, the resistor R61 is connected to the application unit 33. The resistor R62 is connected between the resistor R61 and the capacitor C61. The binarization unit IC61 is connected to the resistor R62. The CPU 31 is connected to the binarization unit IC61. The capacitor C62 is connected between the resistor R62 and the binarization unit IC61. The capacitor C62 is connected to the ground.

The capacitor C71 is connected to a terminal b of the relay 24. That is, the capacitor C71 is connected to the power supply line. The resistor R71 is connected to the capacitor C71. Furthermore, the resistor R71 is connected to the application unit 33. The resistor R72 is connected between the resistor R71 and the capacitor C71. The binarization unit IC71 is connected to the resistor R72. The CPU 31 is connected to the binarization unit IC71. The capacitor C72 is connected between the resistor R72 and the binarization unit IC71. The capacitor C72 is connected to the ground.

The resistor R33 is connected to a terminal c of the relay 24. Furthermore, the resistor R33 is connected to the ground.

The capacitor C81 is connected to a terminal a of a relay 25. That is, the capacitor C81 is connected to the power supply line. The resistor R81 is connected to the capacitor C81. Furthermore, the resistor R81 is connected to the application unit 33. The resistor R82 is connected between the resistor R81 and the capacitor C81. The binarization unit IC81 is connected to the resistor R82. The CPU 31 is connected to the binarization unit IC81. The capacitor C82 is connected between the resistor R82 and the binarization unit IC81. The capacitor C82 is connected to the ground. The relay 25 is an example of a "first relay" in the claims.

The capacitor C91 is connected to a terminal b of the relay 25. That is, the capacitor C91 is connected to the power supply line. The resistor R91 is connected to the capacitor C91. Furthermore, the resistor R91 is connected to the application unit 33. The resistor R92 is connected between the resistor R91 and the capacitor C91. The binarization unit IC91 is connected to the resistor R92. The CPU 31 is connected to the binarization unit IC91. The capacitor C92 is connected between the resistor R92 and the binarization unit IC91. The capacitor C92 is connected to the ground.

That is, a terminal c of the relay 23 (25) on a first side is connected to a terminal b of the relay 21 (22) on a second side. In the welding detector 40, the common resistor R31 (R32) is provided at the terminal c of the relay 21 (22) on the first side, and the capacitor C41 (C81) and the resistor R41 (R81) are provided at the terminal a of the relay 23 (25) on the second side. Furthermore, in the welding detector 40, the capacitor C51 (C91) and the resistor R51 (R91) are provided at the terminal b of the relay 23 (25) on the second side, and the capacitor C11 (C21) and the resistor R11 (R21) are provided at the terminal a of the relay 21 (22) on the second side.

The CPU 31 determines whether or not the relay 23 (25) is welded based on signals input from the terminals a and b of the relay 23 (25) on the second side via the resistor R31 (R32) and the capacitor C41 or C51 (C81 or C91) and the resistor R41 or R51 (R81 or R91) provided at the terminal a or b of the relay 23 (25) on the second side in a state in which the terminal c of the relay 21 (22) on the first side and the terminal b of the relay 21 (22) on the second side are connected to each other. Furthermore, the CPU 31 determines whether or not the relay 21 (22) is welded based on signals input from the terminals a and b of the relay 21 (22) on the second side via the resistor R31 (R32), the capacitor C41 or C51 (C81 or C91) and the resistor R41 or R51 (R81 or R91) provided at the terminal a or b of the relay 23 (25) on the second side, and the capacitor C11 (C21) and the resistor R11 (R21) provided at the terminal a of the relay 21 (22) on the second side.

Figure 5:
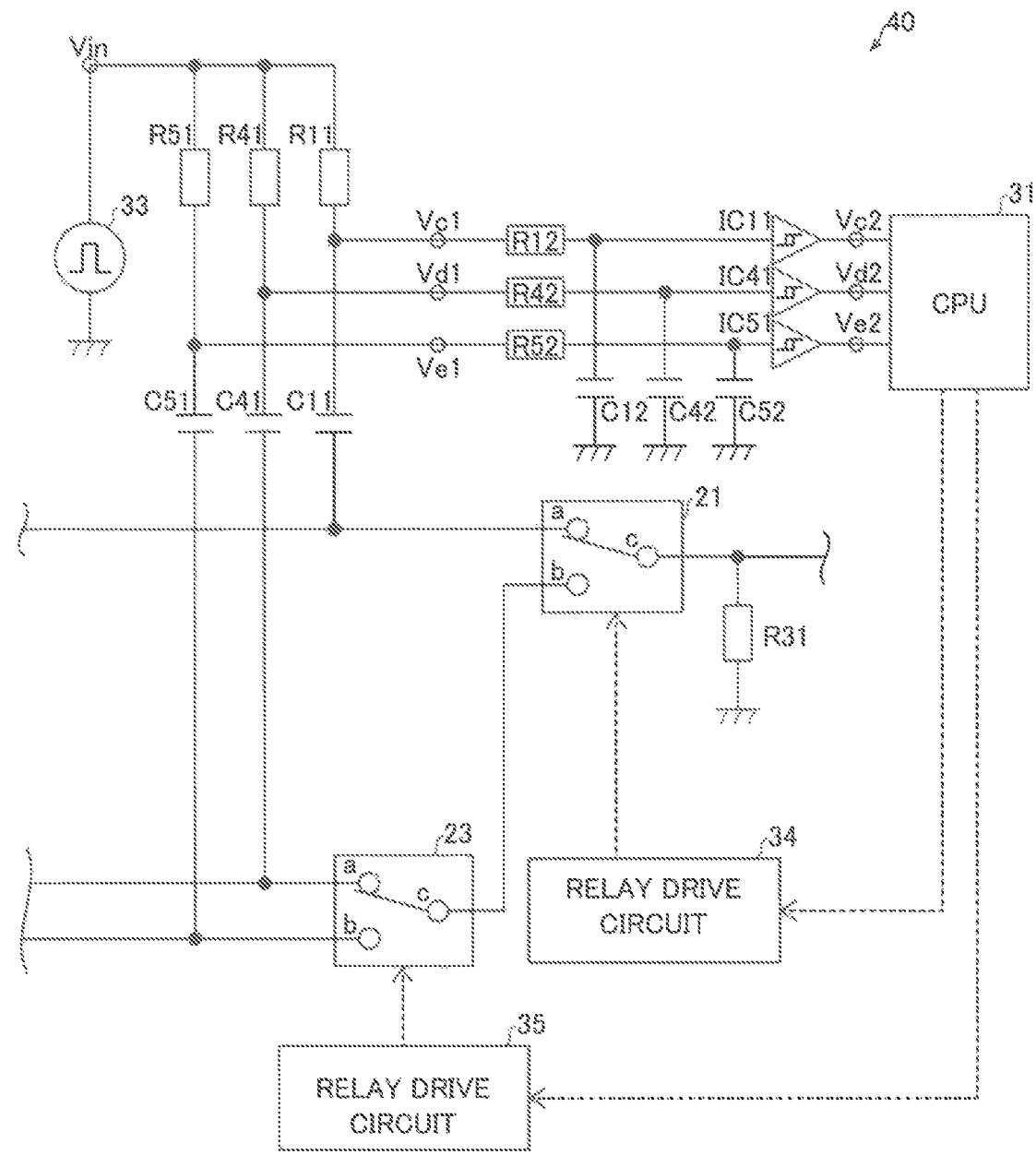
FIG. 5 is a circuit diagram showing a first example at the time of detecting welding of a relay of the power conversion device according to the second embodiment.
Figure 6:
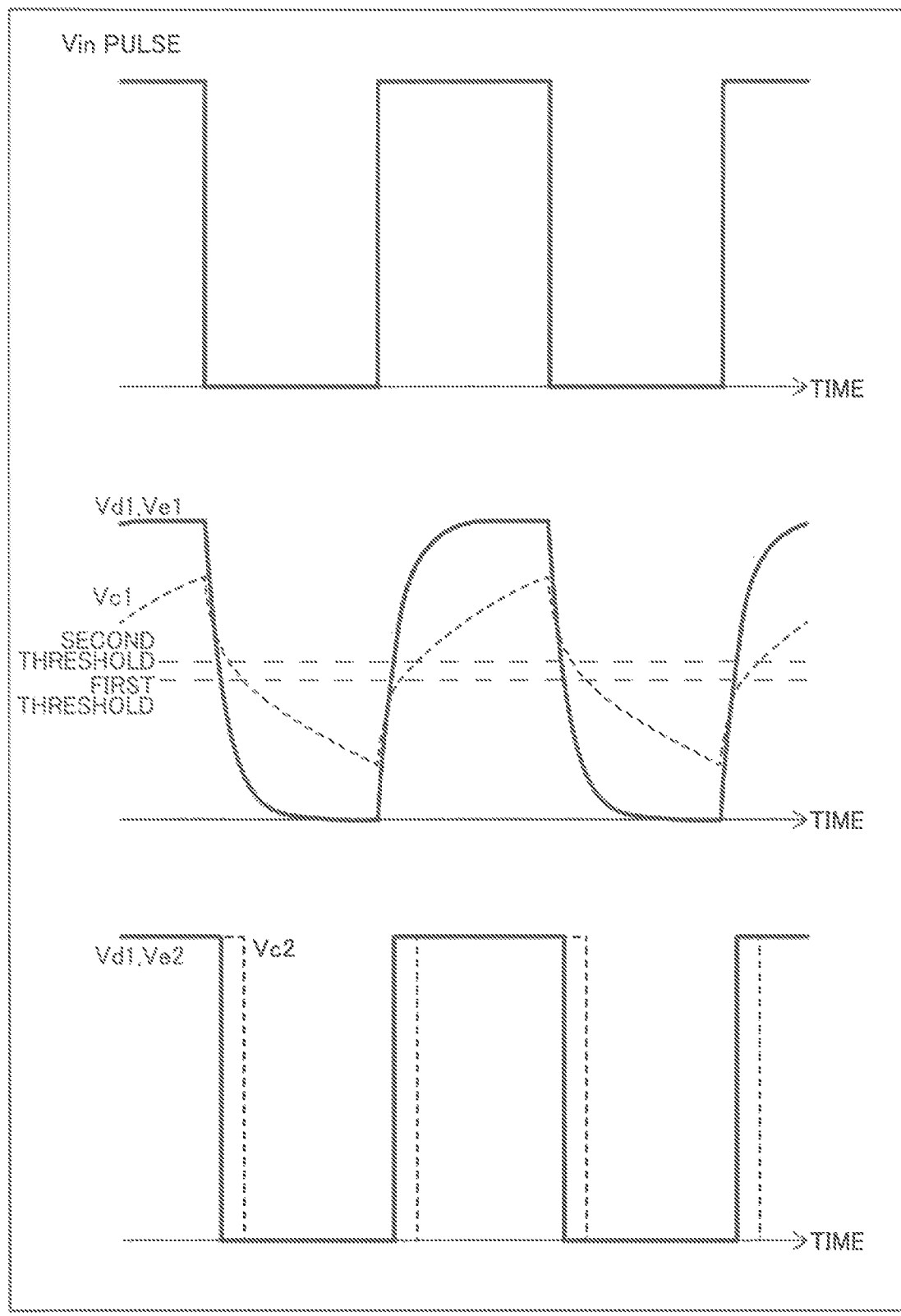
FIG. 6 is a diagram showing a time change of a voltage at each position of the welding detector in the first example at the time of detecting welding of the relay of the power conversion device according to the second embodiment.
Figure 7:
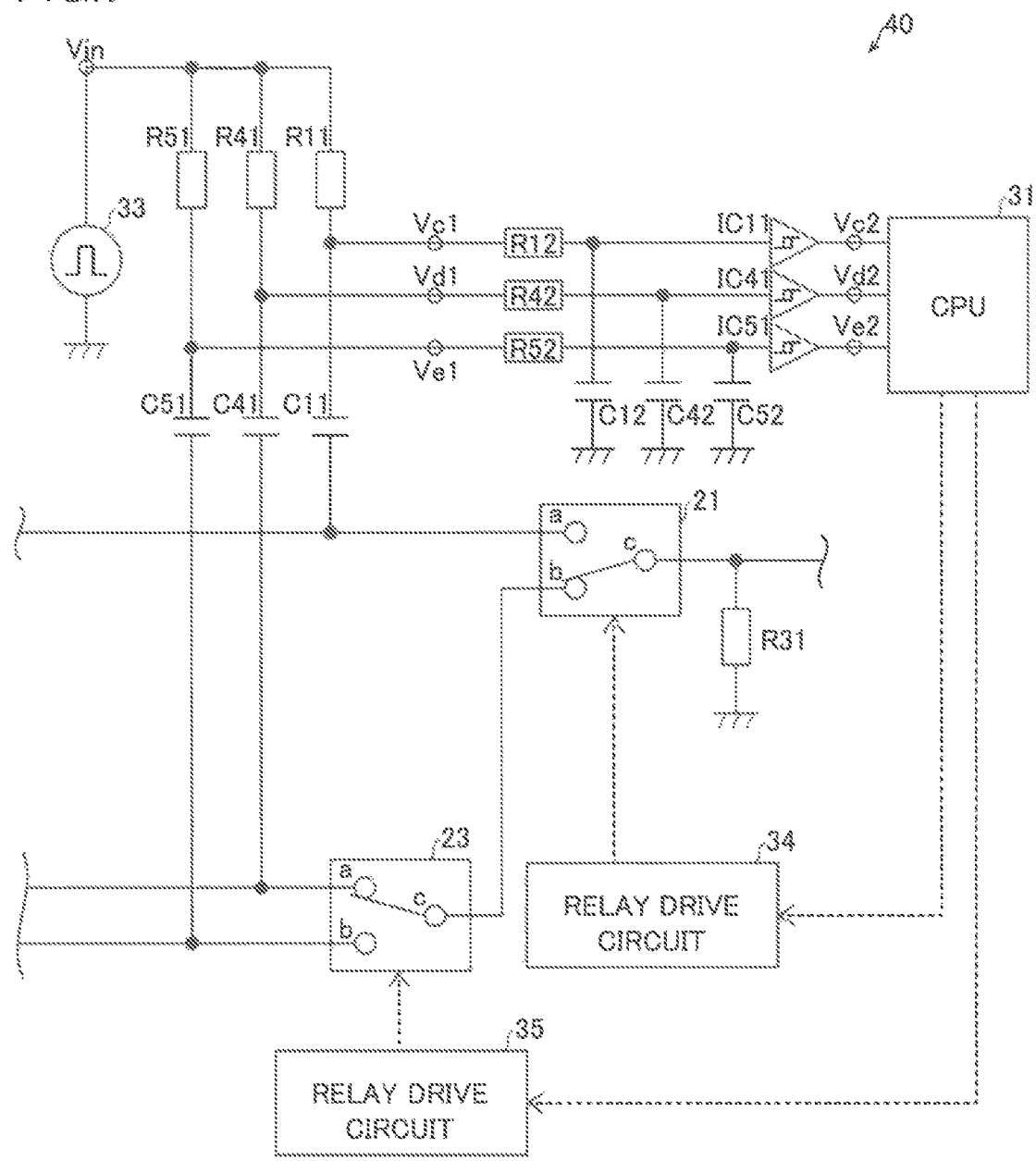
FIG. 7 is a circuit diagram showing a second example at the time of detecting welding of the relay of the power conversion device according to the second embodiment.
Figure 8:
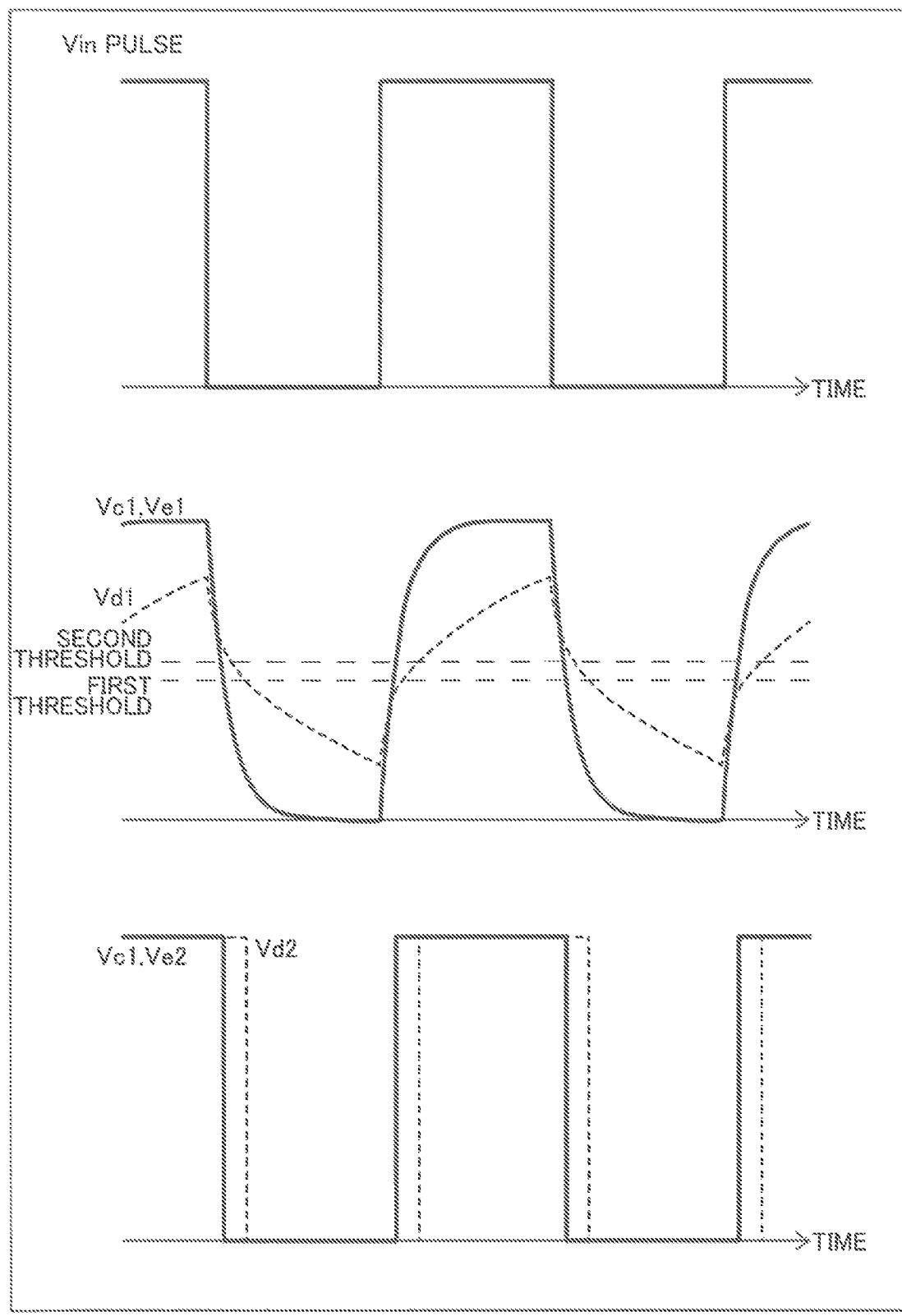
FIG. 8 is a diagram showing a time change of a voltage at each position of the welding detector in the second example at the time of detecting welding of the relay of the power conversion device according to the second embodiment.
Figure 9:
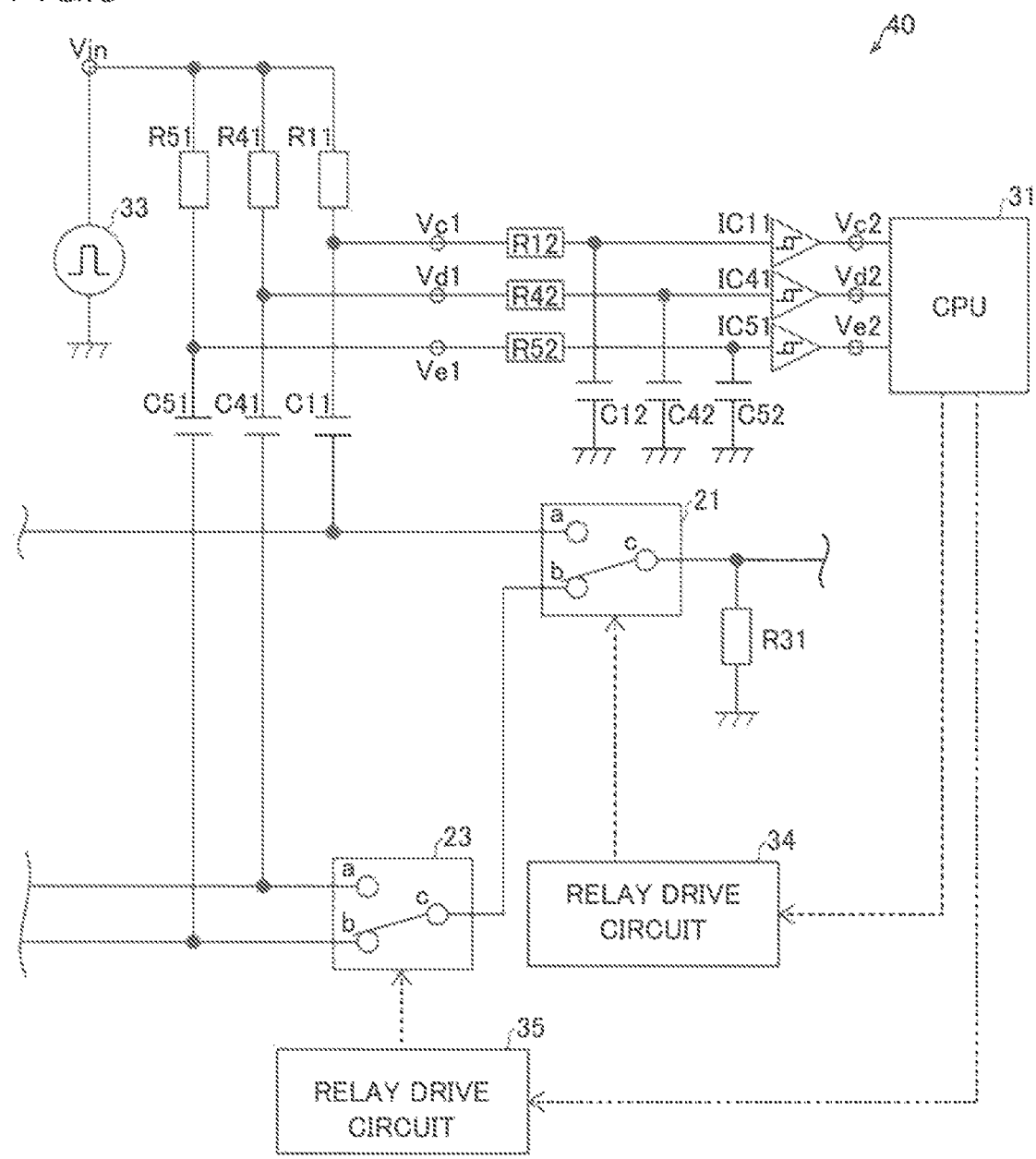
FIG. 9 is a circuit diagram showing a third example at the time of detecting welding of the relay of the power conversion device according to the second embodiment.

As shown in FIGS. 5 to 10, the welding detector 40 detects welding of the relays 21, 22, 23, and 25. Although FIGS. 5, 7, and 9 show the configuration in which the welding detector 40 is provided for the relays 21 and 23, the same applies to the relays 22 and 25. The welding detector for the relay 24 is the same as or similar to that of the first embodiment.

(Welding Detection Operation)

The welding detection operation for the relays 21 and 23 (22 and 25) by the CPU 31 is now described with reference to FIGS. 5 to 10.

A case in which the terminal a of the relay 21 (22) is connected to the terminal c, and the terminal a of the relay 23 (25) is connected to the terminal c as shown in FIG. 5 is described. The CPU 31 controls the application unit 33 to apply a pulse voltage. As shown in FIG. 6, the terminal b of the relay 21 is not connected to the terminal c, and thus a voltage Vd1 (Ve1) has a first-order lag waveform due to the resistor R41 (R51), the resistor R42 (R52), and the capacitor C42 (C52). On the other hand, the terminal a of the relay 21 is connected to the terminal c, and thus a voltage Vc1 has a waveform (further delayed waveform) influenced by the capacitor C11 and the resistor R31 in addition to the resistor R11, the resistor R12, and the capacitor C12. There is the above difference between the terminals b and a of the relay 21, and thus there is a time difference between the output of the binarization unit IC11 and the outputs of the binarization units IC41 and IC51. This time difference causes a waveform (voltage Vc2) on the side with which the relay 21 is conducting to be delayed with respect to a waveform (voltages Vd2 and Ve2) on the side not conducting with the relay 21. From the above, it is possible to determine the connected terminal (a or b) of the relay 21. Regardless of whether the terminal a or b of the relay 23 is connected to the terminal c, the same result is obtained because the terminal b of the relay 21 is not connected to the terminal c.

For example, the CPU 31 applies a pulse voltage from the application unit 33 in a state in which the relay 21 connects the terminal a to the terminal c to output a signal. When detecting an input of the waveform in which the voltage Vc2 is delayed with respect to the voltages Vd2 and Ve2, the CPU 31 determines that the relay 21 is normal (not welded). On the other hand, when detecting an input of the waveform in which one of the voltages Vd2 and Ve2 is delayed with respect to the voltage Vc2, the CPU 31 determines that the relay 21 is abnormal (welding has occurred).

A case in which the terminal b of the relay 21 (22) is connected to the terminal c, and the terminal a of the relay 23 (25) is connected to the terminal c as shown in FIG. 7 is described. The CPU 31 controls the application unit 33 to apply a pulse voltage. As shown in FIG. 8, the terminal b of the relay 23 is not connected to the terminal c, and thus the voltage Ve1 has a first-order lag waveform due to the resistor R51, the resistor R52, and the capacitor C52. On the other hand, the terminal a of the relay 23 is connected to the terminal c, and thus the voltage Vd1 has a waveform (further delayed waveform) influenced by the capacitor C41 and the resistor R31 in addition to the resistor R41, the resistor R42, and the capacitor C42. There is the above difference between the terminals b and a of the relay 23, and thus there is a time difference between the outputs of the binarization unit IC41 and the binarization unit IC51. This time difference causes a waveform (voltage Vd2) on the side with which the relay 23 is conducting to be delayed with respect to a waveform (voltage Ve2) on the side not conducting with the relay 23. From the above, it is possible to determine the connected terminal (a or b) of the relay 23.

For example, the CPU 31 applies a pulse voltage from the application unit 33 in a state in which the relay 23 connects the terminal a to the terminal c to output a signal. When detecting an input of the waveform in which the voltage Vd2 is delayed with respect to the voltages Vc2 and Ve2, the CPU 31 determines that the relay 23 is normal (not welded). On the other hand, when detecting an input of the waveform in which the voltage Ve2 is delayed with respect to the voltage Vd2, the CPU 31 determines that the relay 23 is abnormal (welding has occurred).

Figure 10:
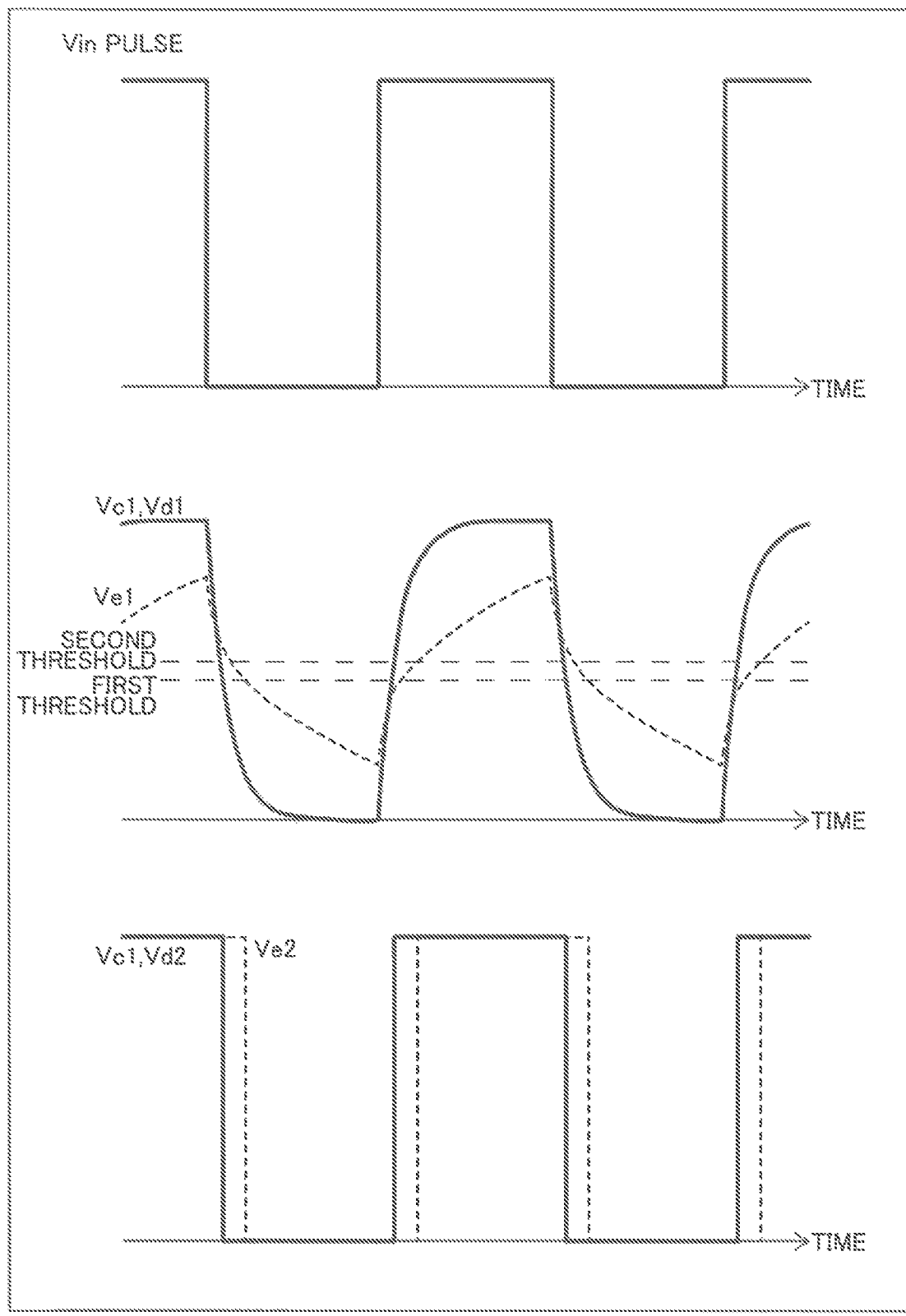
FIG. 10 is a diagram showing a time change of a voltage at each position of the welding detector in the third example at the time of detecting welding of the relay of the power conversion device according to the second embodiment.

A case in which the terminal b of the relay 21 (22) is connected to the terminal c, and the terminal b of the relay 23 (25) is connected to the terminal c as shown in FIG. 9 is described. The CPU 31 controls the application unit 33 to apply a pulse voltage. As shown in FIG. 10, the terminal a of the relay 23 is not connected to the terminal c, and thus the voltage Vd1 has a first-order lag waveform due to the resistor R41, the resistor R42, and the capacitor C42. On the other hand, the terminal b of the relay 23 is connected to the terminal c, and thus the voltage Ve1 has a waveform (further delayed waveform) influenced by the capacitor C51 and the resistor R31 in addition to the resistor R51, the resistor R52, and the capacitor C52. There is the above difference between the terminals a and b of the relay 23, and thus there is a time difference between the outputs of the binarization unit IC41 and the binarization unit IC51. This time difference causes a waveform (voltage Ve2) on the side with which the relay 23 is conducting to be delayed with respect to a waveform (voltage Vd2) on the side not conducting with the relay 23. From the above, it is possible to determine the connected terminal (a or b) of the relay 23.

For example, the CPU 31 applies a pulse voltage from the application unit 33 in a state in which the relay 23 connects the terminal b to the terminal c to output a signal. When detecting an input of the waveform in which the voltage Ve2 is delayed with respect to the voltages Vc2 and Vd2, the CPU 31 determines that the relay 23 is normal (not welded). On the other hand, when detecting an input of the waveform in which the voltage Vd2 is delayed with respect to the voltage Vet, the CPU 31 determines that the relay 23 is abnormal (welding has occurred).

The remaining configurations of the second embodiment are similar to those of the first embodiment.

Advantageous Effects of Second Embodiment

According to the second embodiment, similarly to the first embodiment, a decrease in the reliability of the determiner (CPU 31) that determines whether or not the relay 21 (22 to 25) is welded can be significantly reduced or prevented.

According to the second embodiment, as described above, the CPU 31 determines whether or not the relay 21 (22) is welded based on the signals input from the terminals a and b of the relay 21 (22) on the second side via the resistor R31 (R32), the capacitor C41 or C51 (C81 or C91) and the resistor R41 or R51 (R81 or R91) provided at the terminal a or b of the relay 23 (25) on the second side, and the capacitor C11 (C21) and the resistor R11 (R21) provided at the terminal a of the relay 21 (22) on the second side. Accordingly, the common resistor R31 (R32) can be provided for the relay 23 (25) and the relay 21 (22), and thus it is not necessary to separately provide resistors for the relay 23 (25) and the relay 21 (22). Furthermore, the three capacitors C11, C41, and C51 (C21, C81, and C91) and the three resistors R11, R41, and R51 (R21, R81, and R91) are provided for the terminals a and b of the relay 23 (25) and the terminals a and b of the relay 21 (22), and thus it is not necessary to separately provide four capacitors and four resistors for the terminals a and b of the relay 23 (25) and the terminals a and b of the relay 21 (22). Thus, an increase in the number of components of the welding detector 40 can be significantly reduced or prevented, and the circuit configuration of the welding detector 40 can be simplified.

The remaining advantageous effects of the second embodiment are similar to those of the first embodiment.

MODIFIED EXAMPLES

The embodiments disclosed this time must be considered as illustrative in all points and not restrictive. The scope of the present invention is not shown by the above description of the embodiments but by the scope of claims for patent, and all modifications (modified examples) within the meaning and scope equivalent to the scope of claims for patent are further included.

For example, while the power conversion device is mounted on the electric vehicle in each of the aforementioned first and second embodiments, the present invention is not restricted to this. For example, the power conversion device may alternatively be mounted on a hybrid vehicle driven by electricity and an engine or a fuel-cell vehicle that generates power by a fuel cell. Furthermore, the power conversion device may alternatively be mounted on a train.

While the power conversion device includes a plurality of relays, and the welding detector that detects welding of the plurality of relays is provided in each of the aforementioned first and second embodiments, the present invention is not restricted to this. In the present invention, a welding detector that detects welding of some of the plurality of relays may alternatively be provided.

While welding of the relays that switch connection destinations is detected in each of the aforementioned first and second embodiments, the present invention is not restricted to this. In the present invention, welding of each relay that switches between an on-state and an off-state may alternatively be detected. In this case, with each relay turned on, the time length of a signal based on application of an inspection signal by an application unit may be detected, it may be detected that the relay is in the on-state when the time length of the signal is longer than a threshold (when the delay is large), and it may be detected that the relay is in the off-state when the time length of the signal is shorter than the threshold (when the delay is small).

While welding of the relays that select one from two connection destinations and switch connection destinations is detected in each of the aforementioned first and second embodiments, the present invention is not restricted to this. In the present invention, welding of each relay that selects one from three or more connection destinations and switches a connection destination may alternatively be detected.

While the connection destinations of the relays are switched in switching between charging and discharging, and a discharging destination is switched by the relays in each of the aforementioned first and second embodiments, the present invention is not restricted to this. In the present invention, a charging source may alternatively be switched by the relays.

What is claimed is:
1. A power conversion device comprising:
a power converter to convert power supplied to a vehicle;
a relay provided in a power supply line connected to the power converter; and
a welding detector to detect welding of the relay; wherein the welding detector includes:
a first resistor connected to a terminal of the relay on a first side;
a capacitor and a second resistor, both of which are connected to a terminal of the relay on a second side;
an application unit to apply an inspection signal to the relay via the capacitor and the second resistor; and a determiner connected between the capacitor and the second resistor, the determiner detecting a signal based on application of the inspection signal by the application unit to determine whether or not the relay is welded, the relay includes, on the second side, a first terminal and a second terminal, and switches a terminal connected to the terminal on the first side between the first terminal and the second terminal, the capacitor, the second resistor, and the determiner are connected to each of the first terminal and the second terminal, and the determiner of the welding detector determines whether or not the relay is welded based on signals input from both the first terminal and the second terminal by the application of the inspection signal by the application unit.

2. The power conversion device according to claim 1, wherein the determiner of the welding detector determines whether or not the relay is welded based on a time difference between the signals input from both the first terminal and the second terminal by the application of the inspection signal by the application unit.

3. The power conversion device according to claim 1, wherein the application unit of the welding detector applies a pulse voltage as the inspection signal to the relay.

4. The power conversion device according to claim 1, wherein the determiner is connected between the capacitor and the second resistor via a binarization unit that binarizes the signal based on the application of the inspection signal by the application unit.

5. The power conversion device according to claim 4, wherein the binarization unit binarizes a decreasing signal using a first threshold, and binarizes an increasing signal using a second threshold different from the first threshold.

6. A power conversion device comprising:
a power converter to convert power supplied to a vehicle;
a relay provided in a power supply line connected to the power converter; and
a welding detector to detect welding of the relay;
wherein the welding detector includes:
    a first resistor connected to a terminal of the relay on a first side;
    a capacitor and a second resistor, both of which are connected to a terminal of the relay on a second side;
    an application unit to apply an inspection signal to the relay via the capacitor and the second resistor; and
    a determiner connected between the capacitor and the second resistor, the determiner detecting a signal based on application of the inspection signal by the application unit to determine whether or not the relay is welded, and
wherein the relay includes a first relay and a second relay provided in series in the power supply line;
each of the first relay and the second relay includes, on the second side, a first terminal and a second terminal, and switches a terminal connected to the terminal on the first side between the first terminal and the second terminal;
the terminal of the first relay on the first side is connected to the first terminal of the second relay on the second side;
the welding detector includes:
    a common first resistor provided at the terminal of the second relay on the first side; and
    the capacitor and the second resistor, both of which are provided at each of the first terminal of the first relay on the second side, the second terminal of the first relay on the second side, and the second terminal of the second relay on the second side; and
the determiner, in a state in which the terminal of the second relay on the first side and the first terminal of the second relay on the second side are connected to each other, determines whether or not the first relay is welded based on signals input from the first terminal and the second terminal of the first relay on the second side via the first resistor, and the capacitor and the second resistor, both of which are provided at each of the first terminal and the second terminal of the first relay on the second side, and determines whether or not the second relay is welded based on signals input from the first terminal and the second terminal of the second relay on the second side via the first resistor, the capacitor and the second resistor, both of which are provided at the first terminal or the second terminal of the first relay on the second side, and the capacitor and the second resistor, both of which are provided at the second terminal of the second relay on the second side.

* * * * *